United States Patent
Chien

(10) Patent No.: US 7,141,855 B2
(45) Date of Patent: Nov. 28, 2006

(54) DUAL-THICKNESS ACTIVE DEVICE LAYER SOI CHIP STRUCTURE

(75) Inventor: Ray Chien, Hsin Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 5 days.

(21) Appl. No.: 10/832,264

(22) Filed: Apr. 27, 2004

(65) Prior Publication Data

US 2005/0236669 A1    Oct. 27, 2005

(51) Int. Cl.
*H01L 31/0392* (2006.01)
(52) U.S. Cl. ................................ 257/352; 257/347
(58) Field of Classification Search .................... None
See application file for complete search history.

(56) References Cited

U.S. PATENT DOCUMENTS 6,563,173 B1 *  5/2003  Bolam et al. ............... 257/349
6,570,217 B1 *  5/2003  Sato et al. .................. 257/327
2002/0153911 A1 * 10/2002  Cho et al. .................. 324/754
2002/0175378 A1 * 11/2002  Choe et al. ................. 257/355
2005/0189589 A1 *  9/2005  Zhu et al. ................... 257/347

* cited by examiner

Primary Examiner—Nathan J. Flynn
Assistant Examiner—Johannes Mondt
(74) Attorney, Agent, or Firm—Birch, Stewart, Kolasch & Birch, LLP

(57) ABSTRACT

A dual-thickness active device layer SOI chip structure is provided. The SOI chip structure has an active device layer, at least one oxide region located at a predetermined position of the active device layer and with a first predetermined depth, at least one trench surrounding the oxide region and having a second predetermined depth greater than the first predetermined depth, and a ground layer connected to the active device layer and the oxide region. The SOI structure further has a first silicon-based wafer and a second wafer. Both wafers are bonded together by wafer bonding. At least two different active device layer thicknesses exist to meet requirements of a wide variety of SOI devices placed thereon, with the setting of the oxide region filled with thermal oxide or other oxide variations.

20 Claims, 9 Drawing Sheets

DUAL-THICKNESS ACTIVE DEVICE LAYER SOI CHIP STRUCTURE

BACKGROUND OF THE INVENTION

1. Field of the Invention

The present invention relates to a dual-thickness active device layer SOI chip structure, and more particularly, to a dual-thickness active device layer SOI chip structure having a shallower (buried) oxide region surrounded by a deeper trench. The present invention further provides a method of manufacturing the above SOI chip structure.

2. Description of the Prior Art

FIG. 1 illustrates a cross-sectional view of an SOI chip structure 10 according to the prior art. An SOI structure, by definition, has a silicon-based active device layer placed upon an insulator such as a silicon oxide. The SOI chip structure 10 includes an active device layer 12 for placing SOI devices thereon, an insulating layer 14 under the active device layer 12, and a ground layer 16 under the insulating layer 14. In general, the thickness of the active device layer 12 is uniform, meaning the prior art SOI chip structure 10 is an SOI chip structure having an active device layer with only a single thickness. The insulating layer 14 is also referred to as a buried oxide layer (BOX), which is formed in a wide variety of ways, such as ion-implanting hydrogen ions into the silicon-based substrate and placing the substrate into a comparatively high temperature environment for oxidation so as to form a silicon oxide buried oxide layer at a predetermined depth of the substrate. The active device layer 12, generally speaking, has a thickness d1 thereof ranging from 0.03 to 10 micrometers.

The concept of integrating all IC components in single chip, i.e., SOC, has gradually become the mainstream of current industry development, which also means that the active device layer of the SOI chip structure inevitably has to have different kinds of SOI devices placed thereon. Given that each SOI device has its own characteristics including size, heat dissipation requirement, and operating current/voltage, an SOI chip structure with only one active device layer thickness has trouble in complying with characteristics of all SOI devices. In other words, some SOI devices having greater operating voltages/currents, or greater heat dissipation are preferably placed on the active device layer, which is thicker, while other SOI devices with smaller operating voltages/currents or less heat dissipation are preferably placed on the active device layer, which is thinner. If the active device layer is uniformly thick, SOI devices with greater operating voltages/currents or heat dissipation can still be placed thereon, but have to occupy much more space. This means that the number of different SOI devices that can be located on any single SOI chip structure with a uniform active layer is limited and thus is not efficient from an economic standpoint. Besides, this SOI chip structure 10 is somewhat disadvantageous when it comes to the function of electro-static discharge, because with the constraint of insulating layer 14, the active device layer 12 is difficult to ground effectively and breakdown voltages of SOI devices placed thereon turn out to be insufficient provided the thickness thereof is d1.

SUMMARY OF THE PRESENT INVENTION

The objective of the present invention is to provide a dual-thickness active device layer SOI chip structure.

To achieve the objective, shallower oxide regions are formed on a first silicon-based wafer, and deeper trenches are formed to surround these oxide regions. The thickness of an active layer directly above these oxide regions is less than that of the active layer having no oxide region placed beneath, thereby enabling the placement of several kinds of SOI devices. Thereafter, the first silicon-based wafer is flipped for bonding with another separate wafer (second wafer) serving as a ground layer. The first silicon-based wafer is split then a surface process is conducted to form a dual-thickness active device layer SOI chip structure.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

Figure 1:
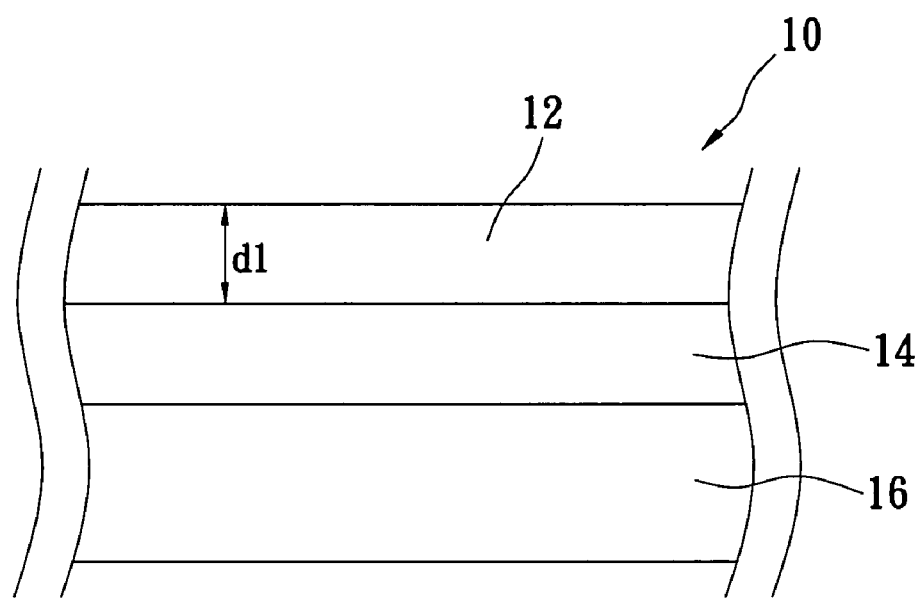
FIG. 1 is a cross sectional view of an SOI chip structure according to the prior art.
Figure 2A:
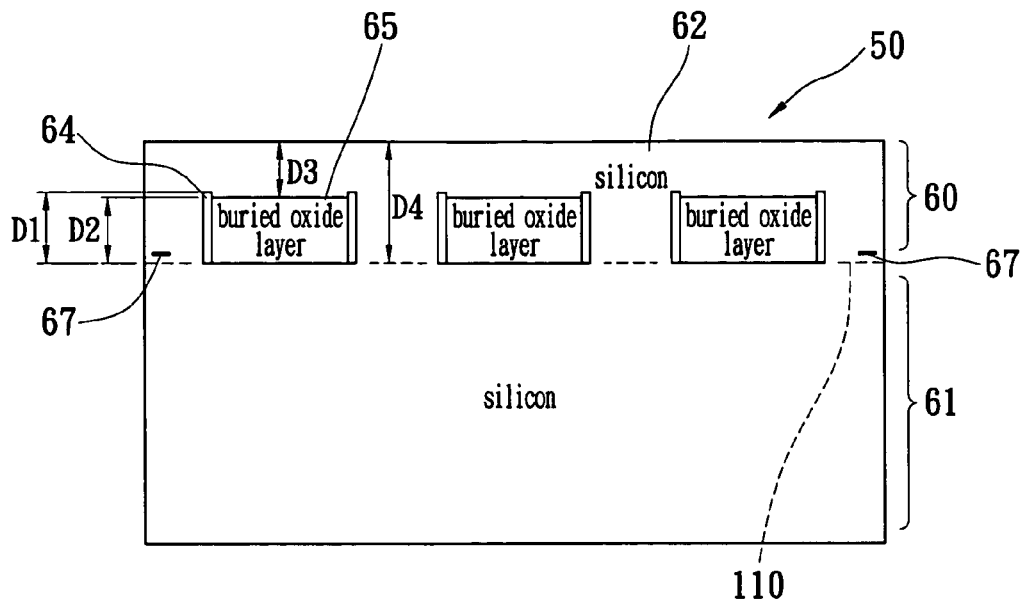
FIGS. 2A to 2C are schematic diagrams of a first embodiment of the present invention.
Figure 2B:
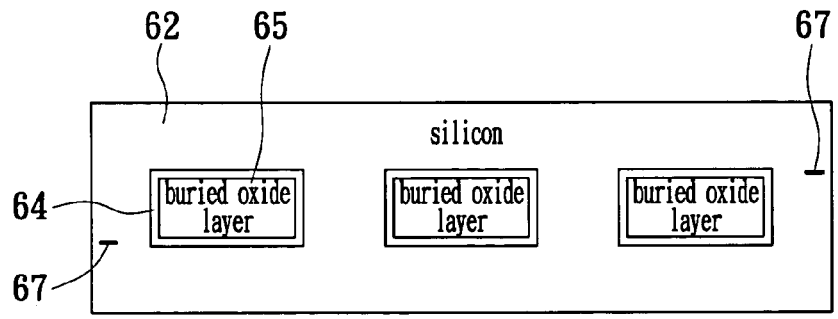
Figure 2C:
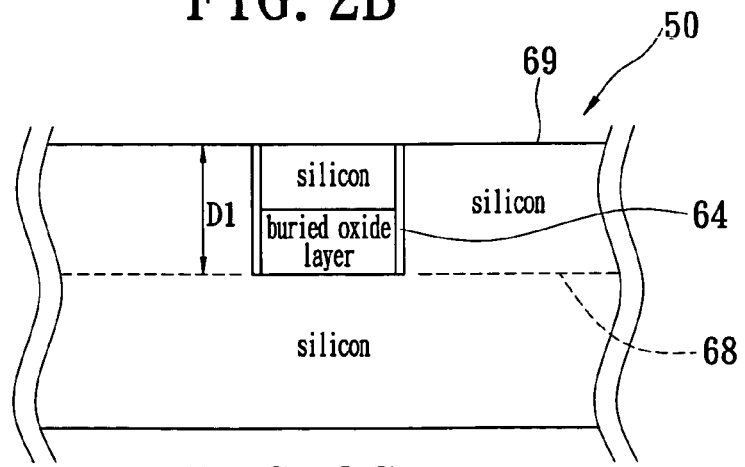

Reference is made to FIGS. 2A, 2B, and 2C, which are schematic diagrams of a first embodiment 50 of a dual-thickness active device layer according to the present invention. A top view of a first silicon-based wafer 60 after manufacturing is illustrated in FIG. 2A. The chip structure 50 based on the present invention includes a first silicon-based wafer 60 and a second silicon-based wafer 61, both of which are bonded together and then split during the manufacturing process therefore.

The first embodiment 50 includes an active device layer 62 for placing SOI devices thereon, at least one trench 64, and at least one buried oxide layer 65 (hereinafter referred to as "BOX") serving as an oxide region and surrounded by the trench 64, in which the active device layer 62 and the BOX 65 are further connected with the second silicon-based wafer 61. The active device layer 62, trench 64, and BOX 65 surrounded by the trench 64 are a part of the first silicon-based wafer 60, as the second silicon-based wafer 61, located under the active device layer 62 and BOX 65 and provided by the second wafer, serves as a ground layer.

As shown in FIG. 2B, the trench 64 surrounding the BOX 65 has a predetermined depth D1 larger than the predetermined depth D2 of the BOX 65. The location of any given BOX 65 is at a predetermined position of the first silicon-based wafer 60 and inside of the position of the trench 64. In practice, the step of forming of the trench 64 is before that of the BOX 65, meaning the position of the trench 64 is obtained as long as the position of the BOX 65 is determined.

Since the BOX 65 is formed by thermal oxidation lattice inflation, a part of silicon material for forming the BOX 65 is inflated in a vertical direction as a consequence of lattice cracking occurring around the peripheral section interconnecting the BOX 65 and first silicon-based wafer active device layer 62 due to the bird's peak effect if no trench 64 exists. After the trench 64 and BOX 65 are formed, the first silicon-based wafer 60 is flipped for bonding with the second silicon-based wafer 61; therefore, the BOX 65 and active device layer 62 connect to the surface of the second silicon-based wafer 61 serving, in this case, as a ground layer. From a standpoint of the active device layer 62, the thickness D3 of the active device layer 62 where a BOX 65 is correspondingly longitudinally formed is apparently less than the thickness D4 of the active device layer 62 where no BOX 65 is correspondingly longitudinally formed. With this embodiment 50 having at least two active device layer thickness (D3 and D4), a greater variety of SOI devices can be placed on the active device layer 62 in spite of having corresponding different requirements on the operating voltage/current and heat dissipation. Some SOI devices with greater operating voltages/currents, power consumption, or grounding currents are can be placed on the active device layer with the thicker active device layer thickness such as D4, while other SOI devices not having that stringent operating voltage/current, heat dissipation, or grounding current requirements can be placed on the active device layer with the thickness of D3. The present application embodiment 50, when compared with the prior art SOI chip structure with only one uniform active device layer thickness, meets more needs of different SOI devices, without consequences such as excessive operating currents or more wafer space occupation, thus not restricting affecting the number that can be placed on the wafer. In addition, with the second separate wafer 61, which serves as a ground layer, the present invention SOI chip structure is more capable of dealing with electrostatic discharge.

The first silicon-based wafer 60 further includes a pair of alignment marks 67 on first predetermined positions beneath the active device layer and on the predetermined surface of the buried oxide layer 65, for facilitating the setting of trenches 64 and oxide regions 65, which is implemented through microlithography and etching, as the stepper and masks are able to align the above-mentioned alignment marks 67. In other words, if alignment marks are capable of providing an effective alignment mechanism, trenches and oxide regions are formed on corresponding predetermined positions through the microlithography and etching with ease.

Reference is made to FIG. 2C, a schematic diagram illustrating the first embodiment 50 according to the present invention SOI chip structure, which is derived from the embodiment shown in FIG. 2A. The depth of trenches 64 D1 ranges from the split surface 69 to the bonding surface 68 of the first silicon-based wafer 60.

Figure 3A:
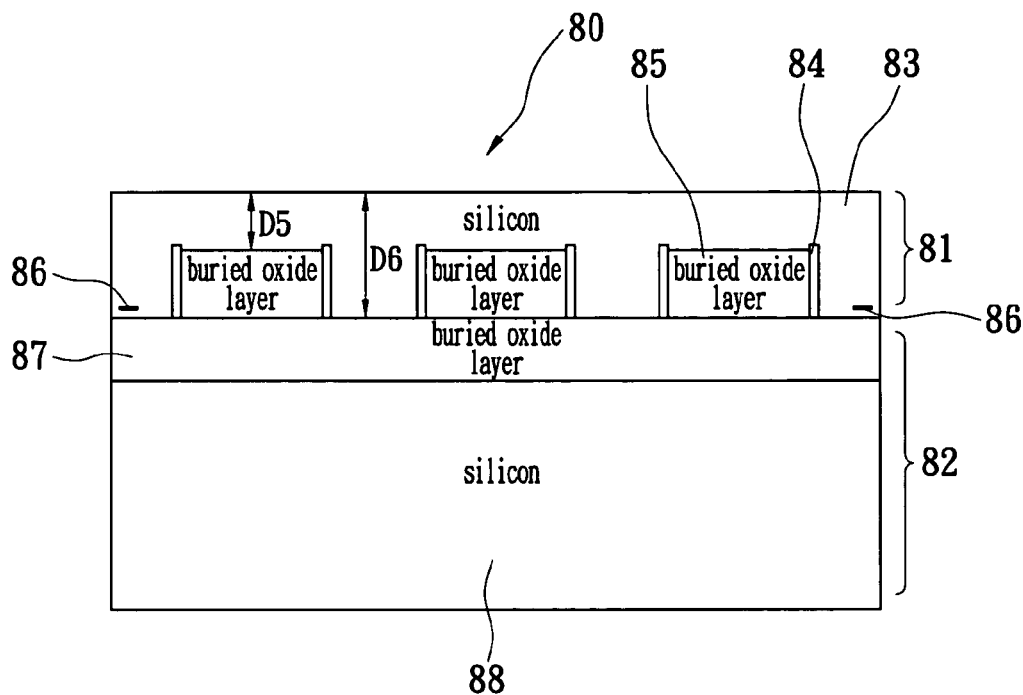
FIGS. 3A and 3B are schematic diagrams of a second embodiment of the present invention.

Reference is made to FIG. 3A, which is a schematic diagram illustrating a second embodiment 80 in accordance with the present invention. This embodiment 80 includes an active device layer 83, at least one trench 84, and buried oxide regions (BOX) 85 surrounded by trenches 84. The active device layer 83 and BOX 85 contact with the underlying buried oxide layer 87, which is further above a silicon layer 88 serving as a ground layer. The active device layer 83, trenches 84, and BOX 85 surrounded by trenches 84 are a part of a first silicon-based wafer 81, as the buried oxide layer 87 and the silicon layer 88 lies under the buried oxide layer 87 are the surface oxide layer and silicon layer of a second silicon-based wafer 82, respectively.

The first silicon-based wafer 81 is flipped and then bonded with the second silicon-based wafer 82, which serves as a supporting and grounding substrate of the whole SOI chip structure 80. A silicon nitride film fills trenches 84, then a thermal oxide fills the oxide region (BOX) 85, and then a CVD-generated silicon oxide fills the remaining space in the trenches 84. Material selections for trenches 84 and BOX 85 vary with respect to practical requirements, as well as in the case shown in FIGS. 2A to 2C. Additionally, the width of trenches preferably ranges between about 0.2 to 5 millimeters, as the depth thereof (the first predetermined depth) preferably ranges between about 0.1 to 10 millimeters.

When compared with the first embodiment in FIGS. 2A and 2B, the SOI chip structure 80 shown in FIG. 3A includes the second silicon-based wafer 82 having a thermal oxide layer 87 formed on the surface thereof prior to being bonded with the first silicon-based wafer 81, in order to allow the thermal oxide layer 87 to contact with the BOX 85 and trenches 84 in the wake of bonding of two wafers. The active device layer 83 which has a BOX 85 longitudinally placed has a thinner active device layer thickness D5 compared to counterpart D6 thereof when no corresponding BOX 85 is placed longitudinally with respect to the active device layer 83. The thicker active device layer 83 is suitable for SOI devices with greater operating voltages or heat dissipation requirements, and, in the meantime, the thinner one is suitable for having SOI devices with less operating voltages or heat dissipation requirements placed instead. The embodiment 80 further includes a pair of alignment marks 86 for the purpose of having the stepper and masks thereof directly align with these alignment marks 86 when microlithography is performed at predetermined positions to further etch silicon material away before the BOX 85 is formed. Preferably, positions of these alignment marks 86 are at edges of the first silicon-based wafer active device layer 83.

The second silicon-based wafer 82 further includes a silicon layer 88 serving as a ground layer in addition to having an oxide layer 87 on the surface thereof. As shown in FIG. 3A, even when SOI devices (not shown) are placed on the active device layer 83, an interconnect layer (not shown either) is further formed above the active device layer 83 to connect these SOI devices electrically. SOI devices with greater operating currents further need conductive vias punched through the non-conductive oxide region 87, from the active device layer 83 to the silicon layer 88, so as to ground the SOI devices.

Figure 3B:
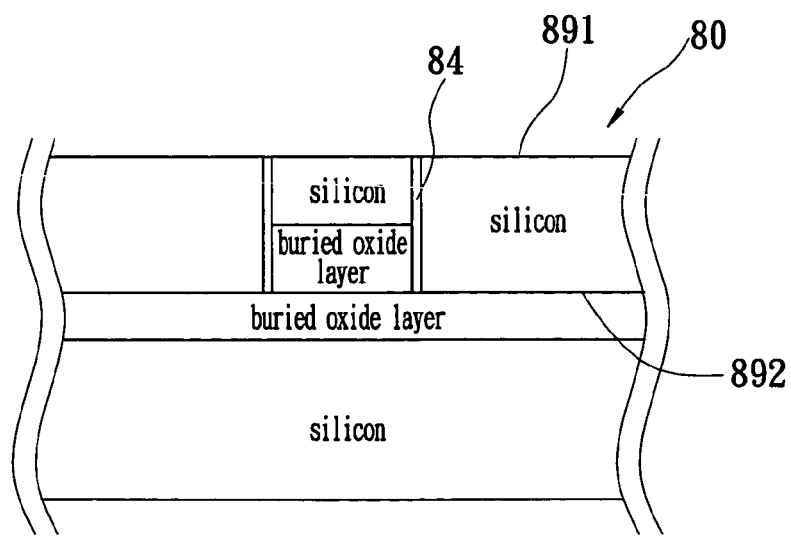

Reference is made to FIG. 3B, another schematic diagram of the second embodiment 80, in which the depth of trenches 84 ranges from the split surface 891 to the bonding surface 892 of the first silicon-based wafer 81.

Figure 4A:
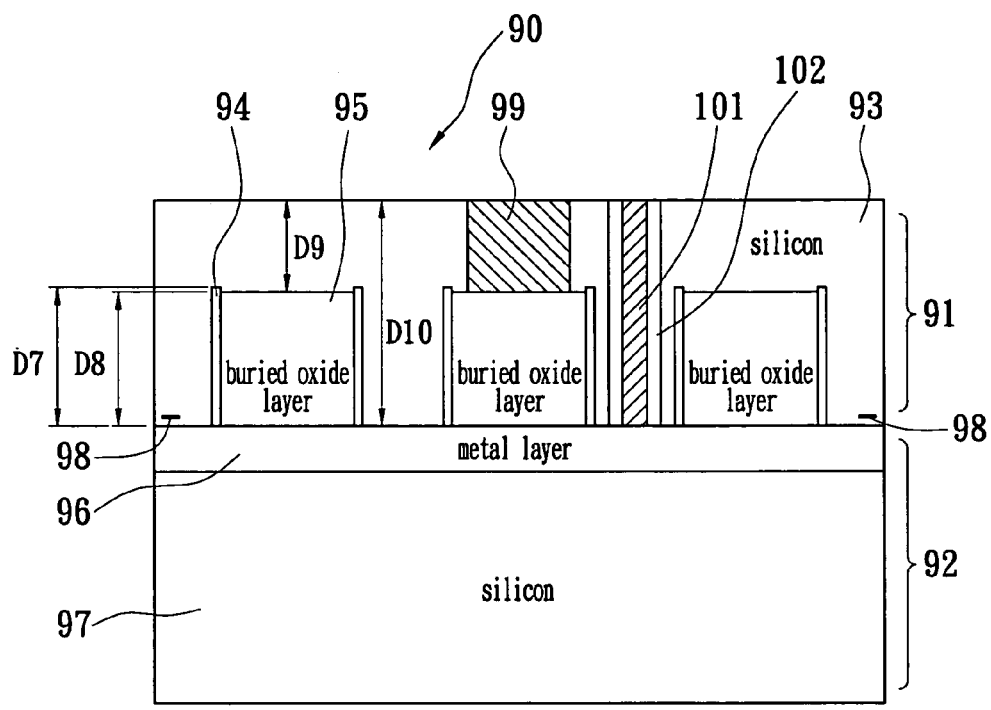
FIGS. 4A and 4B are schematic diagrams of a third embodiment of the present invention.

Reference is made to FIG. 4A, which is a schematic diagram showing a third embodiment 90 of the present invention. The third embodiment 90 includes an active device layer 93, at least one trench 94, and at least one BOX 95 correspondingly surrounded by the trench 94. The present embodiment 90 further includes a metal layer 96 underlying and contacting the active device layer 93 and BOX 95. As in previously mentioned embodiments, a silicon layer 97 serving as a ground layer is also provided in the present embodiment 90. The active device layer 93, trench 94, and BOX 95 surrounded by the trench 94 are a part of the first silicon-based wafer 91, and the silicon layer 97 is a part of the second silicon-based wafer 92. The metal layer 96, a surface metal layer, is selectively to be a part of the first silicon-based wafer 91 or second silicon-based wafer 92.

The first silicon-based wafer 91 also includes an active device layer 93, trenches 94 having a depth of D7, and BOX 95 with a depth of D8 and surrounded by trenches 94. With the disclosure of BOX 95, the active device layer 93 consequently has at least two thickness D9 and D10, rendering the placement of SOI devices at different active device layer 93 with respect to operating or heat dissipation demands thereof viable. A silicon nitride film is first deposited on trenches 94 of the first silicon-based wafer 91 and then trenches 94 are filled with a CVD-generated amorphous silicon oxide, as the BOX 95 consists of a thermal oxide.

Compared with the embodiment shown in FIG. 3A, the embodiment in FIG. 4A includes second silicon-based wafer 92 having a metal layer 96 formed on the surface thereof and then bonded with the flipped first silicon-based wafer 91. The metal layer 96 is single-layer metal or a multi-layer metal system (compound) including metals or alloys such as Ti, Ta, TiN, TaN, Au, or Cu. Before the first silicon-based wafer 91 is bonded, a thin metal layer is further formed on the top surface thereof, in order to enhance the bonding strength of two wafers.

Still, as SOI devices 99 placed on the active device layer 93 are going to connect to the ground layer 97, the conductive via 101 is selectively surrounded by another insulating layer 102 and in this case only extends to the metal layer 96 to be grounded to the ground layer, given that the metal layer 96 itself is conductive. SOI devices 99 are connected to the conductive via 101 through an interconnect layer above the active device layer 93. The present embodiment 93 further includes at least one pair of alignment marks 98 located at two opposite ends of the first silicon-based wafer active device layer 93.

Figure 4B:
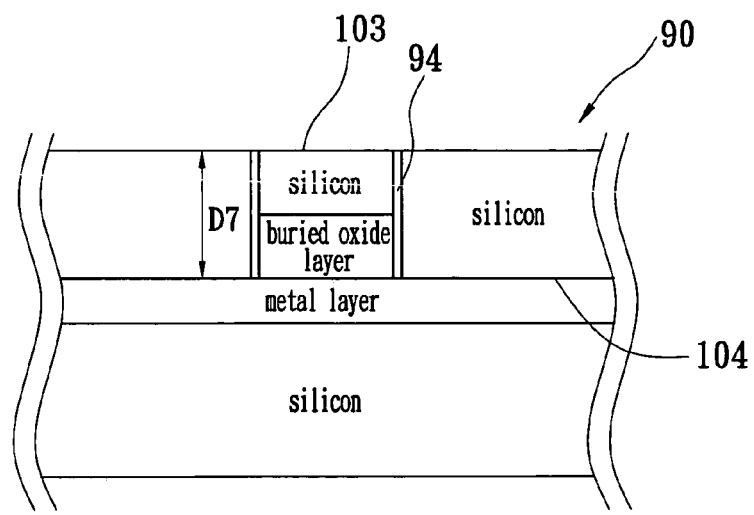

Reference is made to FIG. 4B of another schematic diagram showing the third embodiment 80 of the present invention. The depth D7 of the trench 94 ranges from the split surface 103 to the lower silicon surface 104 of the first silicon-based wafer 90.

Reference is made to FIGS. 5A to 5J, which are simplified flow charts illustrating steps of manufacturing the SOI chip structure according to the present invention. Generally speaking, the whole manufacturing process starts with processing the first silicon-based wafer. Thereafter, the first silicon-based wafer is flipped for subsequent bonding with the second silicon-based wafer serving as a ground layer.

Figure 5A:
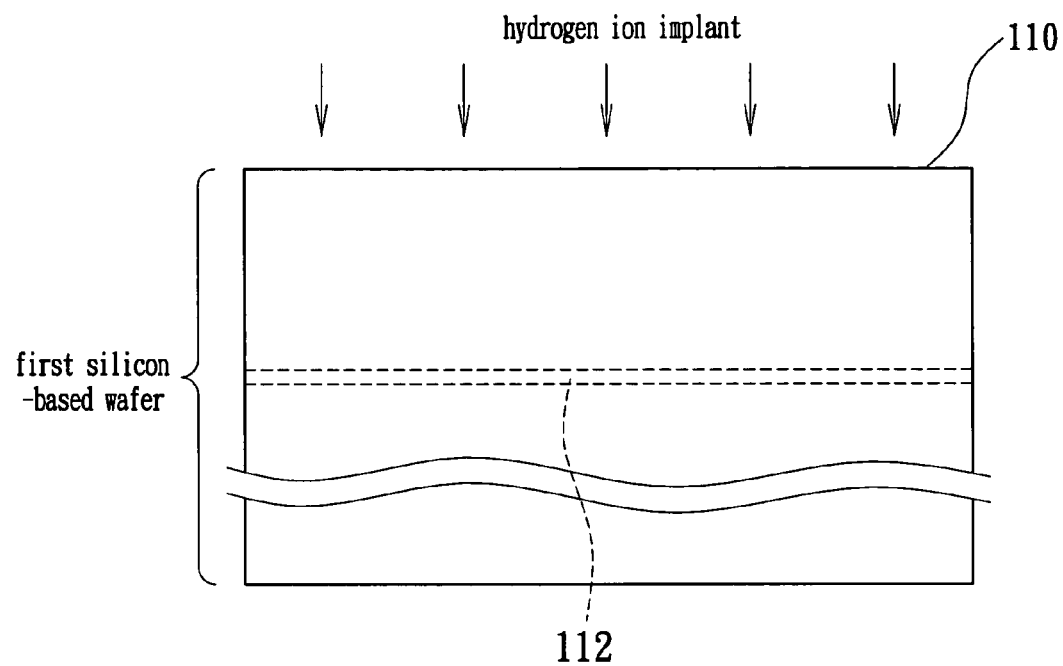
FIGS. 5A to 5J are schematic diagrams showing simplified manufacturing steps of the present invention.

FIGS. 5A to 5H emphasize process for the first silicon-based wafer. At first, a layer of hydrogen ion is ion-implanted through the first predetermined surface 110 to a predetermined plane having a third predetermined depth, which will be the split surface (plane) 112 of the first silicon-based wafer (FIG. 5A). The third predetermined depth is determined by the hydrogen ion implanting energy.

Figure 5B:
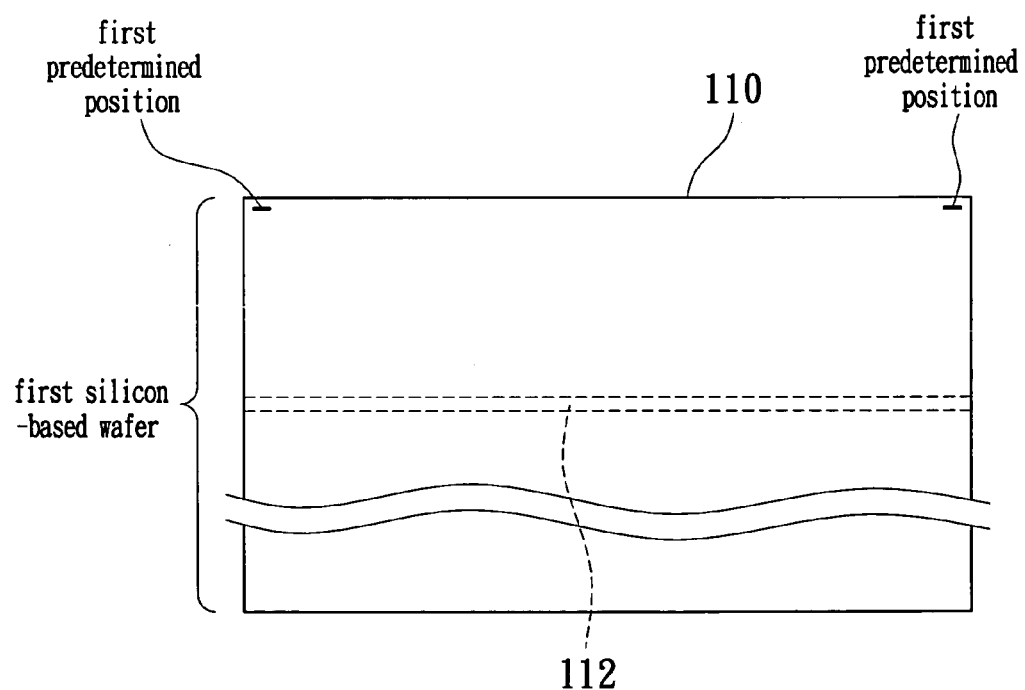
Figure 5C:
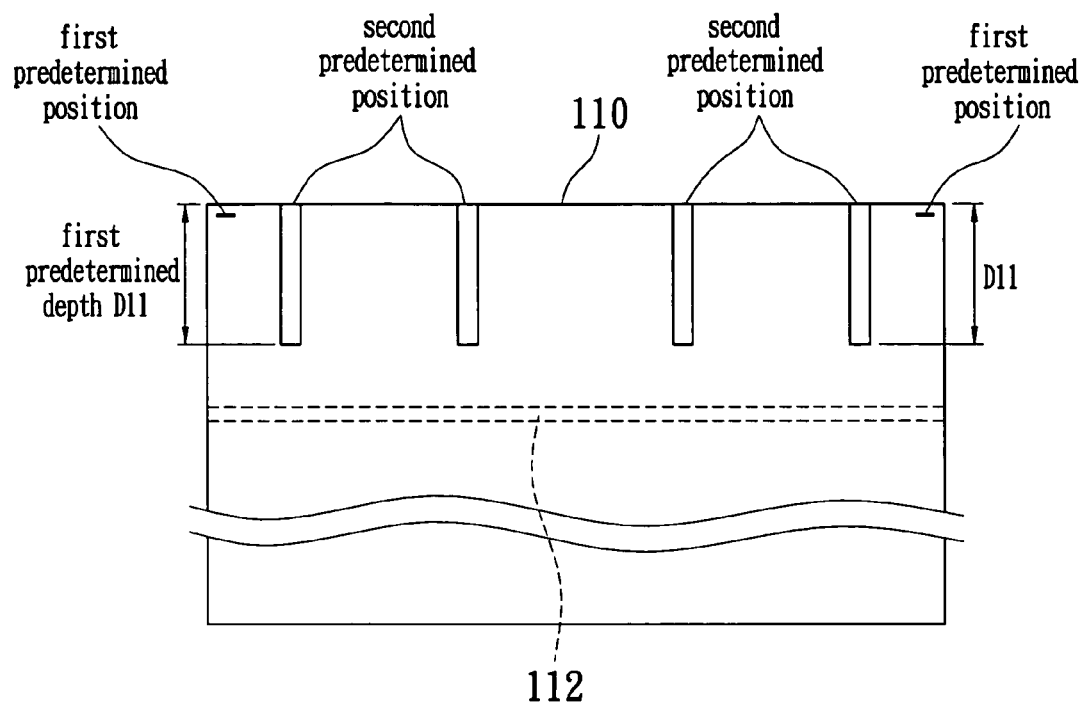
Figure 5D:
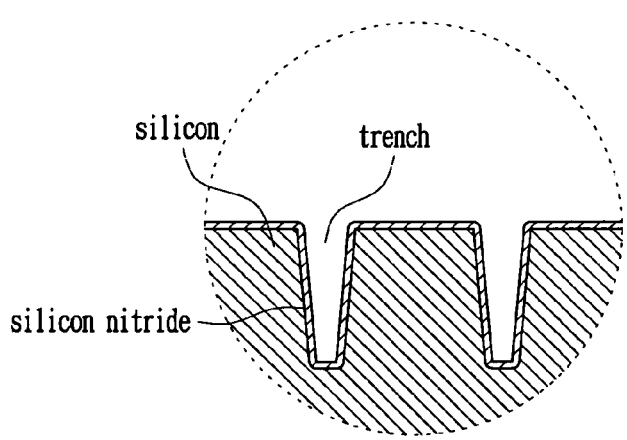
Figure 5E:
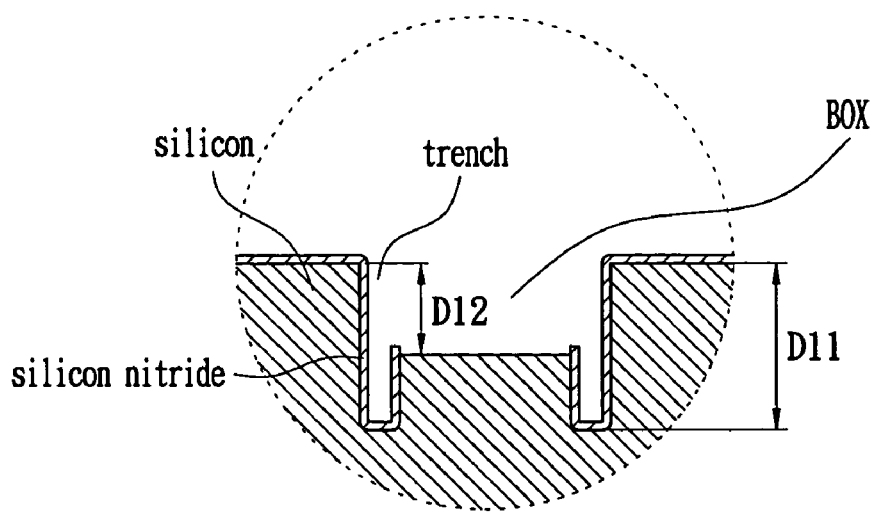

FIG. 5B illustrates the step of placing at least one pair of alignment marks at first predetermined positions of the first silicon-based wafer. The purpose of setting these alignment marks is mentioned above. The stepper and photo marks required take advantage of and directly align with these alignment marks to form trenches at second predetermined positions through etching. As positions of these trenches are determined, BOX areas supposed to be inside the trenches are decided. FIG. 5C shows the step of forming trenches having a depth of D11 at second predetermined positions. Then, a silicon nitride is filled into the first predetermined surface 110 and trenches, as shown in FIG. 5D. A silicon layer with a fourth predetermined depth of D12 is etched away, in which D12 is less than the aforementioned D11 (as shown in FIG. 5E); so as to prepare for the BOX areas inside of second predetermined positions. Thereafter, the exposed silicon lattice, which is exposed by the silicon nitride, of the silicon layer is transformed into a thermal silicon oxide through thermal oxidation, as the thickness of the silicon nitride has to prevent other covered silicon lattice from being thermally oxidized during thermal oxidation. Given that the exposed silicon oxide inflates vertically during thermal oxidation, trenches are required in the present invention to avoid the bird's peak effect. Further, the depth D11 of trenches (the first predetermined depth) preferably is about more than two times of the fourth predetermined depth D12.

Figure 5F:
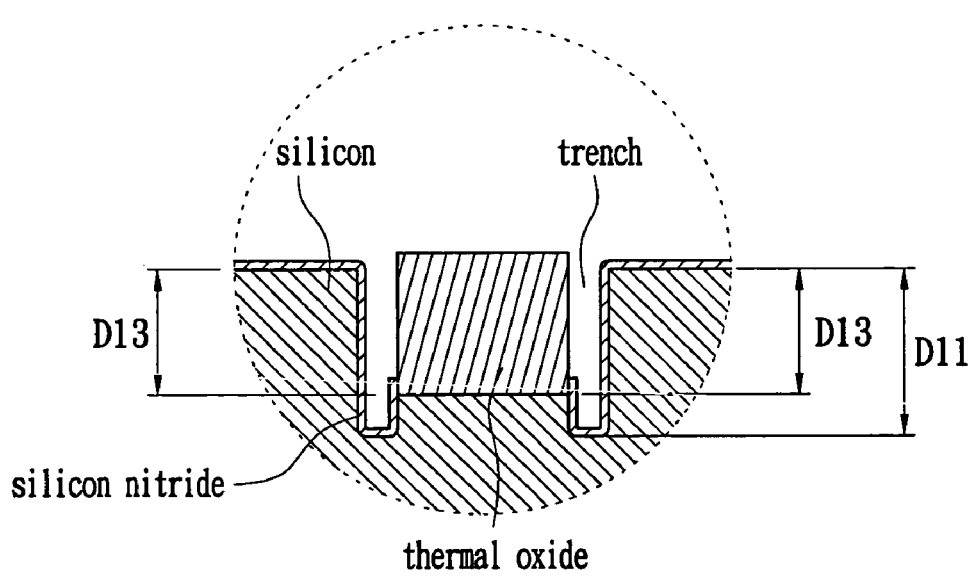

FIG. 5F provides a schematic diagram showing the BOX is formed inside the second predetermined position through thermal oxidation, in which the depth of the BOX D13 is less than the depth of the trench D11.

Figure 5G:
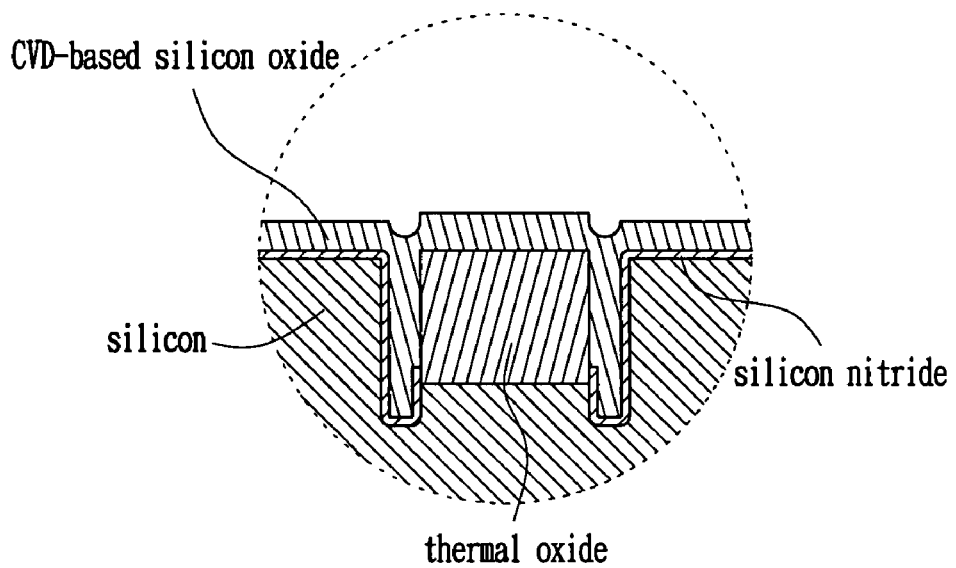
Figure 5H:
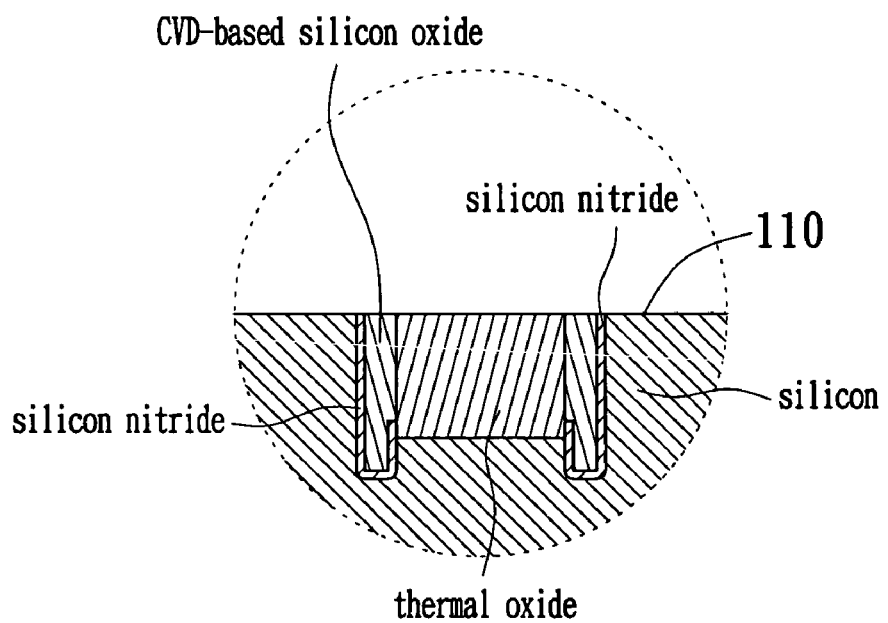
Figure 5I:
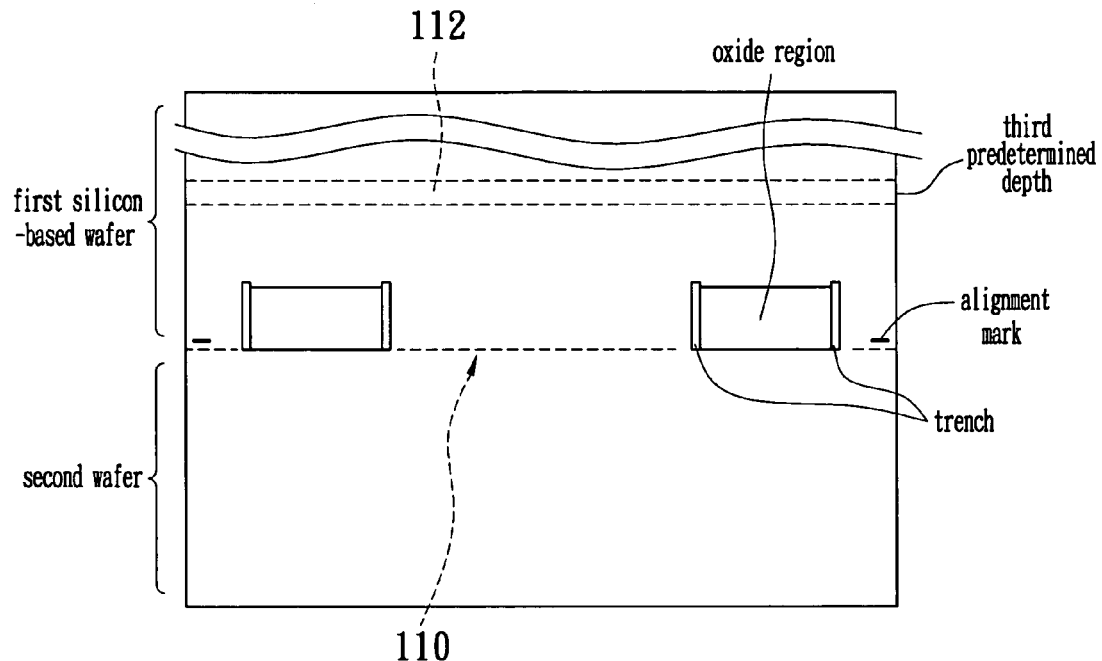
Figure 5J:
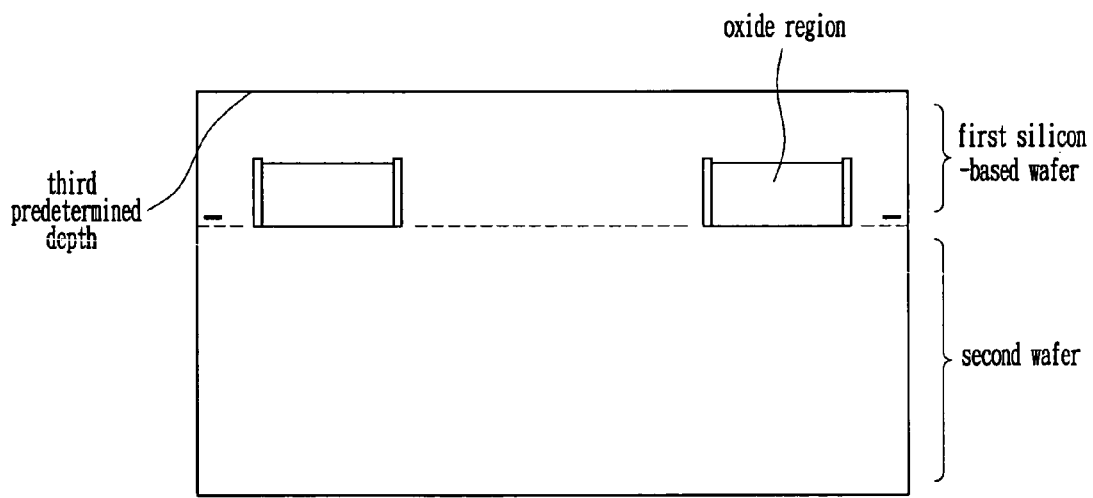

FIG. 5G shows a step of filling the remaining space of the trench, with a CVD-based amorphous silicon oxide placed upon the silicon nitride layer and the thermal silicon oxide. Later, the excess CVD silicon oxide on the first predetermined surface 110 and silicon nitride film, other than counterparts thereof for fill up the trench, is removed by CMP (chemical mechanical polishing), not only to eliminate the excess CVD silicon oxide and silicon nitride film but to planarize the first predetermined surface, as shown in FIG. 5H. Steps such as performing high temperature hydrogen annealing in order to repair damaged silicon lattices, and taking advantage of HF solvent or vapor so as to eliminate a little bit of the silicon oxide surface of the first silicon-based wafer are added to the whole manufacturing procedure. FIG. 5I shows a step of first flipping the silicon-based wafer and bonding the same to a second silicon-based wafer by wafer bonding. A water jet is then used to split the first silicon-based wafer along the plane having the third predetermined depth, so as to form the SOI chip structure shown in FIG. 5J. CMP or high temperature hydrogen annealing is performed upon the splitting plane having the third predetermined depth after being split by the water jet, for planarization or repairing damaged lattices.

Prior to bonding with the first silicon-based wafer, the second silicon-based wafer may have a thermal oxide layer or a conductive metal layer (system) formed on the surface thereof in advance.

In comparison with the prior art, the present invention employs the setting of BOX areas to form an SOI chip structure having at least two active device layer thickness. Thereby, SOI devices with different operating requirements are able to be placed on the present invention SOI chip structure without any compromise such as sacrificing the variety of SOI device selection or occupying too much space of the active device layer and lowering down the total number of SOI devices placed on any single given wafer. Additionally, with the second separate wafer, the SOI chip structure shown in FIGS. 2 and 4 has a superior performance against electrostatic discharge.

Those skilled in the art will readily observe that numerous modifications and alterations of the device may be made while retaining the teachings of the invention. Accordingly, the above disclosure should be construed as limited only by metes and bounds of the appended claims.

What is claimed is:

1. A dual-thickness active device layer SOI chip structure comprising:
    an active device layer;
    at least one oxide region located at a predetermined position of said active device layer and having a first predetermined depth;
    at least one trench surrounding said oxide region and having a second predetermined depth greater than said first predetermined depth; and
    a ground layer directly connected to said active device layer and said oxide region;
    wherein said trench is filled with a silicon oxide and said trench has a silicon nitride film deposited before filling with said silicon oxide.

2. The SOI chip structure of claim 1, wherein said active device layer, said oxide region, and said trench are a part of a first silicon-based wafer, and said ground layer is a part of a second wafer, wherein said second silicon-based wafer and said first silicon-based wafer are bonded together by wafer bonding.

3. The SOI chip structure of claim 1, wherein said ground layer is a single crystalline silicon layer.

4. The SOI chip structure of claim 1, wherein said oxide region is formed with a thermal oxide.

5. The SOI chip structure of claim 1, further comprising at least one pair of alignment marks disposed upon said active device layer.

6. A dual-thickness active device layer SOI chip structure comprising:
   an active device layer;
   a ground layer;
   an oxide layer above said ground layer and connecting to said active device layer;
   at least one oxide region being above the oxide layer and connecting to said oxide layer, the oxide region being located at a predetermined position of said active device layer, and the oxide region having a first predetermined depth; and
   at least one trench surrounding said oxide region, and the trench having a second predetermined depth greater than said first predetermined depth;
   wherein the active device layer has at least a first device region directly connected to the oxide region and at least a second device region directly connected to the oxide layer, and the first device region has a thickness different from a thickness of the second device region.

7. The SOI chip structure of claim 6, wherein said active device layer, said oxide region, and said trench are a part of a first silicon-based wafer, and said ground layer is a part of a second wafer, wherein said first silicon-based wafer and said second silicon-based wafer are bonded together by wafer bonding.

8. The SOI chip structure of claim 6, wherein said trench is filled with a silicon oxide.

9. The SOI chip structure of claim 8, wherein said trench has a silicon nitride film deposited thereon before filling with said silicon oxide.

10. The SOI chip structure of claim 6, wherein said ground layer is a single crystalline silicon layer.

11. The SOI chip structure of claim 6, further comprising at least one pair of alignment marks disposed upon said active device layer.

12. A dual-thickness active device layer SOI chip structure comprising:
    an active device layer;
    at least one oxide region located at a predetermined position of said active device layer and having a first predetermined depth;
    at least one trench surrounding said oxide region and having a second predetermined depth greater than said first predetermined depth;
    a ground layer; and
    an metal layer above said ground layer and connecting to said active device layer and said oxide region, both being above said metal layer.

13. The SOI chip structure of claim 12, wherein said active device layer, said oxide region, and said trench are a part of a first silicon-based wafer, and said ground layer and said metal layer are a part of a second wafer, wherein said first silicon-based wafer and said second silicon-based wafer are bonded together by wafer bonding.

14. The SOI chip structure of claim 12, wherein said metal layer is a metal system.

15. The SOI chip structure of claim 12, further comprising at least one pair of alignment marks upon said active device layer.

16. The SOI chip structure of claim 12, wherein said trench is filled with a silicon oxide.

17. The SOI chip structure of claim 12, wherein said trench has a silicon nitride film deposited thereon before filling with said silicon oxide.

18. The SOI chip structure of claim 12, wherein said ground layer is a single crystalline silicon layer.

19. The SOI chip structure of claim 1, further comprising an oxide layer above said ground layer and connecting to said active device layer;
    wherein the active device layer has at least a first device region directly connected to the oxide region and at least a second device region directly connected to the oxide layer.

20. The SOI chip structure of claim 19, wherein the first device region has a thickness different from a thickness of the second device region.

* * * * *